(12) United States Patent
Iwamoto et al.

(10) Patent No.: US 12,191,839 B2
(45) Date of Patent: Jan. 7, 2025

(54) ACOUSTIC WAVE DEVICE

(71) Applicant: Murata Manufacturing Co., Ltd., Nagaokakyo (JP)

(72) Inventors: Hideki Iwamoto, Nagaokakyo (JP); Katsuya Daimon, Nagaokakyo (JP); Tetsuya Kimura, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 263 days.

(21) Appl. No.: 17/875,496

(22) Filed: Jul. 28, 2022

(65) Prior Publication Data

US 2022/0368305 A1    Nov. 17, 2022

Related U.S. Application Data

(63) Continuation of application No. PCT/JP2021/004392, filed on Feb. 5, 2021.

(30) Foreign Application Priority Data

Feb. 6, 2020   (JP) .................................. 2020-019048

(51) Int. Cl.
*H03H 9/02*   (2006.01)
*H03H 9/145*   (2006.01)

(52) U.S. Cl.
CPC .... *H03H 9/02228* (2013.01); *H03H 9/02015* (2013.01); *H03H 9/02559* (2013.01); *H03H 9/14541* (2013.01)

(58) Field of Classification Search
CPC .. H03H 9/02574; H03H 9/02559; H03H 9/25; H03H 9/02015; H03H 9/02228; H03H 9/02834; H03H 9/02866; H03H 9/02992; H03H 9/145; H03H 9/14541; H03H 9/02543; H03H 3/08; H03H 9/02157; H03H 9/175; H03H 9/02637; H03H 9/131; H03H 9/02102; H03H 9/02566; H03H 9/02818; H03H 9/6483; H03H 9/02897;

(Continued)

(56) References Cited

U.S. PATENT DOCUMENTS 6,154,105 A    11/2000   Fujimoto et al.
6,353,371 B1    3/2002   Kadota et al.
(Continued)

FOREIGN PATENT DOCUMENTS

JP    H05129882 A    5/1993
JP    H07254835 A    10/1995
(Continued)

OTHER PUBLICATIONS

International Search Report in PCT/JP2021/004392, mailed Apr. 6, 2021, 3 pages.
(Continued)

*Primary Examiner* — Lincoln D Donovan
*Assistant Examiner* — Tyler J Pereny
(74) *Attorney, Agent, or Firm* — Keating & Bennett, LLP (57) ABSTRACT

An acoustic wave device includes a support substrate, a piezoelectric layer, and an IDT electrode. The piezoelectric layer is over the support substrate. The IDT electrode is on the piezoelectric layer, and includes a plurality of electrode fingers. An intersecting width of the plurality of electrode fingers is equal to or smaller than about 5λ.

16 Claims, 8 Drawing Sheets

(58) Field of Classification Search
CPC .......... H03H 9/14538; H03H 9/02551; H03H 9/568; H03H 9/02535; H03H 9/14502; H03H 9/1457; H03H 9/64
See application file for complete search history.

(56) References Cited

U.S. PATENT DOCUMENTS

| | | | |
|---|---|---|---|
| 2013/0285768 A1 | 10/2013 | Watanabe et al. | |
| 2017/0093372 A1* | 3/2017 | Yokoyama | H03H 9/6423 |
| 2017/0250674 A1 | 8/2017 | Takamine et al. | |
| 2021/0273633 A1* | 9/2021 | Osada | H03H 9/542 |
| 2021/0297060 A1* | 9/2021 | Omura | H03H 9/564 |

FOREIGN PATENT DOCUMENTS

| | | |
|---|---|---|
| JP | H11298290 A | 10/1999 |
| JP | 2000261287 A | 9/2000 |
| WO | 2012086639 A1 | 6/2012 |
| WO | 2015198709 A1 | 12/2015 |
| WO | 2016103953 A1 | 6/2016 |

OTHER PUBLICATIONS

Written Opinion in PCT/JP2021/004392, mailed Apr. 6, 2021, 3 pages.
Office Action in JP2021-576191, mailed May 30, 2023, 2 pages.
Office Action in JP2021-576191, mailed Jun. 11, 2024, 3 pages.

* cited by examiner

ACOUSTIC WAVE DEVICE

CROSS REFERENCE TO RELATED APPLICATIONS

This application claims the benefit of priority to Japanese Patent Application No. 2020-019048 filed on Feb. 6, 2020 and is a Continuation Application of PCT Application No. PCT/JP2021/004392 filed on Feb. 5, 2021. The entire contents of each application are hereby incorporated herein by reference.

BACKGROUND OF THE INVENTION

1. Field of the Invention

The present invention relates to an acoustic wave device, and more particularly, to an acoustic wave device including an interdigital transducer (IDT) electrode.

2. Description of the Related Art

International Publication No. 2012/086639 describes an acoustic wave device. The acoustic wave device described in International Publication No. 2012/086639 includes a high acoustic velocity support substrate (support substrate), a piezoelectric film (piezoelectric layer), and an IDT electrode. In the acoustic wave device described in International Publication No. 2012/086639, the IDT electrode is formed on one surface of the piezoelectric film.

However, in the acoustic wave device described in International Publication No. 2012/086639, there is an issue that a spurious response of a higher order mode may be generated in a band higher in frequency than an excitation mode to be used for obtaining required characteristics. As a result, the characteristics of the device are deteriorated.

SUMMARY OF THE INVENTION

Preferred embodiments of the present invention provide acoustic wave devices that are each able to reduce a spurious response of a higher order mode that is generated in a band higher in frequency than an excitation mode to be used to obtain required characteristics.

An acoustic wave device according to a preferred embodiment of the present invention includes a support substrate, a piezoelectric layer, and an IDT electrode. The piezoelectric layer is provided over the support substrate in a thickness direction of the support substrate. The IDT electrode is on the piezoelectric layer and includes a plurality of electrode fingers. An intersecting width of the plurality of electrode fingers is equal to or smaller than about $5\lambda$.

The acoustic wave devices according to preferred embodiments of the present invention are each able to reduce a spurious response of a higher order mode that is generated in a band higher in frequency than an excitation mode to be used to obtain required characteristics.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, acoustic wave devices according to preferred embodiments of the present invention will be described with reference to the drawings. FIG. 1, FIG. 2, FIG. 6, and FIG. 7 are schematic views, and ratios of sizes and thicknesses of respective elements in the drawings do not necessarily reflect actual dimensional ratios.

Preferred Embodiment (1) Acoustic Wave Device

An overall configuration of the acoustic wave device according to a preferred embodiment of the present invention will be described with reference to the drawings.

Figure 1:
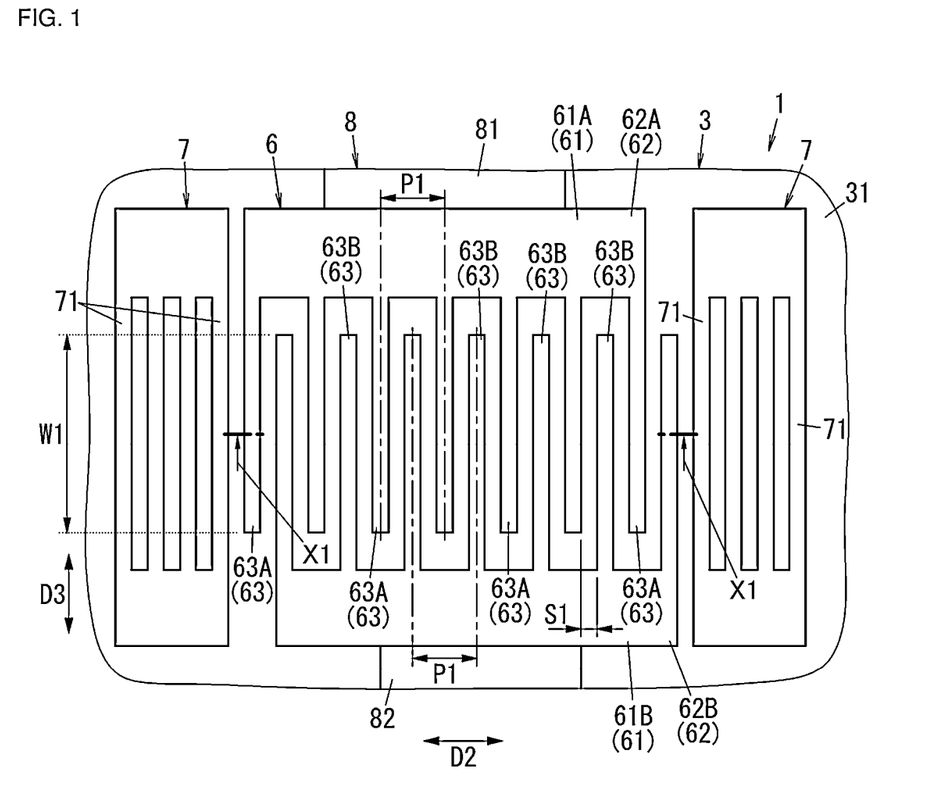
FIG. 1 is a front view of an acoustic wave device according to a preferred embodiment of the present invention.
Figure 2:
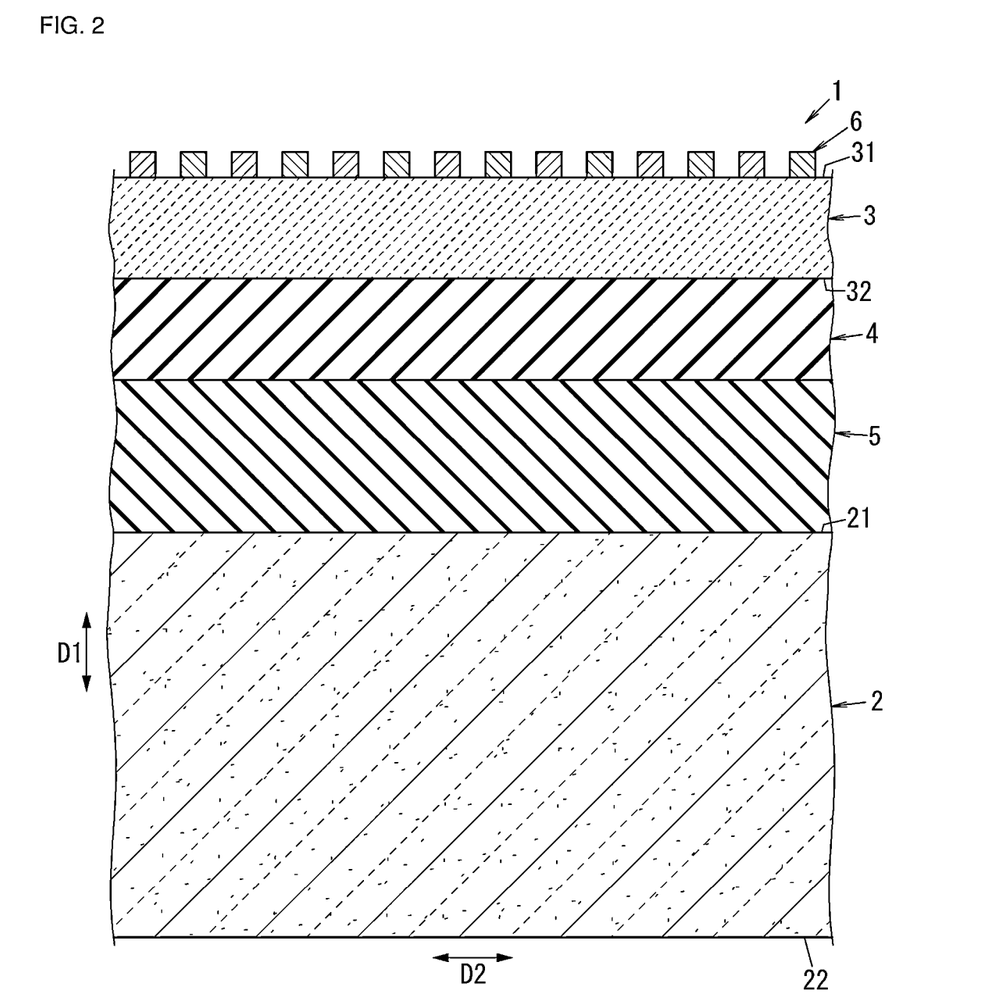
FIG. 2 is a cross-sectional view of the above-described acoustic wave device taken along the line X1-X1 in FIG. 1.

As illustrated in FIG. 1 and FIG. 2, an acoustic wave device 1 according to the present preferred embodiment includes a support substrate 2, a piezoelectric layer 3, a low acoustic velocity film 4, a high acoustic velocity film 5, and an interdigital transducer (IDT) electrode 6. In addition, the acoustic wave device 1 further includes two reflectors 7, a wiring portion 8, and a protective film (not illustrated).

In an example illustrated in FIG. 1, the acoustic wave device 1 includes, for example, one IDT electrode 6, but the number of IDT electrodes 6 is not limited to one, and a plurality of IDT electrodes may be included. When the acoustic wave device 1 includes a plurality of IDT electrodes 6, for example, a band pass filter may be configured by electrically connecting a plurality of surface acoustic wave resonators including the plurality of IDT electrodes 6.

(2) Elements of Acoustic Wave Device

Hereinafter, each element of the acoustic wave device 1 according to the present preferred embodiment will be described with reference to the drawings.

(2.1) Support Substrate

As illustrated in FIG. 2, the support substrate 2 includes a first main surface 21 and a second main surface 22 that are opposed to each other. The first main surface 21 and the second main surface 22 are opposed to each other in a thickness direction (a first direction D1) of the support substrate 2. The support substrate 2 has, for example, a rectangular or substantially rectangular shape in a plan view from the thickness direction (first direction D1) of the support substrate 2. The shape of the support substrate 2 is not limited to the rectangular or substantially rectangular shape, and may be, for example, a square or substantially square shape.

In the support substrate 2, an acoustic velocity of a bulk wave propagating through the support substrate 2 is higher than the acoustic velocity of an acoustic wave propagating through the piezoelectric layer 3. Here, the bulk wave propagating through the support substrate 2 is a bulk wave having the lowest acoustic velocity among a plurality of bulk waves propagating through the support substrate 2.

The support substrate 2 is, for example, a silicon substrate. The support substrate 2 preferably has a thickness of, for example, equal to or larger than about $10\lambda$ ($\lambda$: the wavelength of an acoustic wave determined by an electrode finger pitch P1) and equal to or smaller than about 180 μm, and the thickness is, for example, about 120 μm as an example. When the support substrate 2 is a silicon substrate, a plane orientation of the first main surface 21 of the support substrate 2 is, for example, a (100) plane, but is not limited thereto, and may be, for example, a (110) plane, a (111) plane, or the like. A propagation orientation of an acoustic wave can be set without being limited by the plane orientation of the first main surface 21 of the support substrate 2.

A material of the support substrate 2 is not limited to silicon. The support substrate 2 may include, for example, at least one material selected from the group consisting of silicon, aluminum nitride, aluminum oxide, silicon carbide, silicon nitride, sapphire, lithium tantalate, lithium niobate, crystal, alumina, zirconia, cordierite, mullite, steatite, forsterite, magnesia, and diamond.

(2.2) Piezoelectric Layer

As illustrated in FIG. 2, the piezoelectric layer 3 is provided over the support substrate 2. The phrase that "the piezoelectric layer 3 is provided over the support substrate 2" includes a case where the piezoelectric layer 3 is directly provided on the support substrate 2 without another layer interposed therebetween and a case where the piezoelectric layer 3 is indirectly provided on the support substrate 2 with another layer interposed therebetween.

In an example illustrated in FIG. 2, the piezoelectric layer 3 is indirectly provided on the support substrate 2. More specifically, the piezoelectric layer 3 is provided at the first main surface 21 side of the support substrate 2 with a low acoustic velocity film 4 and a high acoustic velocity film 5 interposed between the piezoelectric layer 3 and the support substrate 2 in the thickness direction (first direction D1) of the support substrate 2. The piezoelectric layer 3 includes a first main surface 31 and a second main surface 32. The first main surface 31 and the second main surface 32 are opposed to each other in the thickness direction (first direction D1) of the support substrate 2.

The piezoelectric layer 3 is made of, for example, a $\Gamma°$ Y-cut X-propagation LiTaO$_3$ piezoelectric single crystal. The $\Gamma°$ Y-cut X-propagation LiTaO$_3$ piezoelectric single crystal is a LiTaO$_3$ single crystal cut by a plane having, as a normal line, a Z-axis rotated by $\theta°$ about an X-axis defining the center axis in a Z-axis direction from a Y-axis when the X-axis, the Y-axis, and the Z-axis define as three crystal axes of the LiTaO$_3$ piezoelectric single crystal, and a single crystal where a surface acoustic wave propagates in an X-axis direction. A cut angle of the piezoelectric layer 3 is, for example, about $\theta=\Gamma+90°$, when $\Gamma$ [°] is the cut angle, and ($\varphi$, $\theta$, $\psi$) are the Euler angles of the piezoelectric layer 3. However, $\Gamma$ is synonymous with $\Gamma\pm180\times n$. Here, n is a natural number. The piezoelectric layer 3 is not limited to the $\Gamma°$ Y-cut X-propagation LiTaO$_3$ piezoelectric single crystal, and may be, for example, $\Gamma°$ Y-cut X-propagation LiTaO$_3$ piezoelectric ceramics.

The thickness of the piezoelectric layer 3 is, for example, equal to or smaller than about $3.5\lambda$, when $\lambda$ is the wavelength of the acoustic wave determined by the electrode finger pitch P1 (see FIG. 1) of the IDT electrode 6. When the thickness of the piezoelectric layer 3 is equal to or smaller than about $3.5\lambda$, a Q value of the acoustic wave device 1 increases. Additionally, by setting the thickness of the piezoelectric layer to be equal to or smaller than about $2.5\lambda$, a temperature coefficient of frequency (TCF) can be reduced. Further, by setting the thickness of the piezoelectric layer 3 to be equal to or smaller than about $1.5\lambda$, an acoustic velocity of the acoustic wave can be easily adjusted. For example, when the wavelength $\lambda$ of the acoustic wave is about 2 μm, the piezoelectric layer 3 has a thickness of about $0.2\lambda$ (about 400 nm). Note that the thickness of the piezoelectric layer 3 is not limited to a value being equal to or smaller than about $3.5\lambda$, and may be larger than about $3.5\lambda$.

When the thickness of the piezoelectric layer 3 is equal to or smaller than about $3.5\lambda$, the Q value increases as described above, but a higher order mode is generated. In the acoustic wave device 1, the low acoustic velocity film 4 and the high acoustic velocity film 5 are provided so as to reduce the higher order mode even when the thickness of the piezoelectric layer 3 is equal to or smaller than about $3.5\lambda$.

In the acoustic wave device 1, a longitudinal wave, an SH wave, or an SV wave, or a composite mode thereof is present as a mode of the acoustic wave propagating through the piezoelectric layer 3. In the acoustic wave device 1, a mode having an SH wave as a main component is used as a main mode. The higher order mode is a spurious mode generated at a side higher in frequency than the main mode of the acoustic wave propagating through the piezoelectric layer 3. Whether or not the mode of the acoustic wave propagating through the piezoelectric layer 3 is the "main mode that is a mode having an SH wave as a main component" can be checked, for example, by analyzing the displacement distribution with a finite element method using parameters such as parameters of the piezoelectric layer 3 (the material, Euler angles, thickness, and the like), parameters of the IDT electrode 6 (the material, thickness, electrode finger pitch, and the like), parameters of the low acoustic velocity film 4 (the material, thickness, and the like), parameters of the high acoustic velocity film 5 (the material, thickness, and the like) and the like, and analyzing the strain. The Euler angles of the piezoelectric layer 3 can be obtained by analysis.

The material of the piezoelectric layer 3 is not limited to lithium tantalate (LiTaO$_3$) and may be, for example, lithium niobate (LiNbO$_3$), zinc oxide (ZnO), aluminum nitride (AlN), or lead zirconate titanate (PZT). When the piezoelectric layer 3 is made of, for example, a Y-cut X-propagation LiNb03 piezoelectric single crystal or piezoelectric ceramics, the acoustic wave device 1 can use, as the main mode, the mode having the SH wave as the main component by using a Love wave as the acoustic wave. Note that the single crystal material and the cut angle of the piezoelectric layer 3 may be appropriately determined in accordance with, for example, required specifications of a filter (filter characteristic such as a bandpass characteristic, an attenuation characteristic, a temperature characteristic, a band width and the like).

(2.3) Low Acoustic Velocity Film

As illustrated in FIG. 2, the low acoustic velocity film 4 is provided over the support substrate 2. The phrase that "the low acoustic velocity film 4 is provided over the support substrate 2" includes a case where the low acoustic velocity film 4 is directly provided on the support substrate 2 without another layer interposed therebetween and a case where the low acoustic velocity film 4 is indirectly provided on the support substrate 2 with another layer interposed therebetween.

In the example illustrated in FIG. 2, the low acoustic velocity film 4 is provided between the support substrate 2 and the piezoelectric layer 3 in the thickness direction (first direction D1) of the support substrate 2. More specifically, the low acoustic velocity film 4 is provided at the first main surface 21 side of the support substrate 2 with the high acoustic velocity film 5 interposed between the low acoustic velocity film 4 and the support substrate 2. The low acoustic velocity film 4 is a film in which an acoustic velocity of a bulk wave propagating through the low acoustic velocity film 4 is lower than an acoustic velocity of a bulk wave propagating through the piezoelectric layer 3.

Since the low acoustic velocity film 4 is provided between the support substrate 2 and the piezoelectric layer 3, the acoustic velocity of the acoustic wave decreases. An acoustic wave primarily has a property that energy is concentrated on a medium having a low acoustic velocity. Thus, it is possible to improve the advantageous effect of confining the energy of an acoustic wave in the piezoelectric layer 3 and the IDT electrode 6 in which the acoustic wave is excited. As a result, loss can be reduced and the Q value of the acoustic wave device 1 can be improved as compared with a case where the low acoustic velocity film 4 is not provided.

A material of the low acoustic velocity film 4 is, for example, silicon oxide. Note that the material of the low acoustic velocity film 4 is not limited to silicon oxide, and may be, for example, glass, silicon oxynitride, tantalum oxide, a compound obtained by adding fluorine, carbon, or boron to silicon oxide, or a material including each of the above-described materials as a main component.

When the low acoustic velocity film 4 is made of silicon oxide, the temperature characteristic can be improved. The acoustic constant of lithium tantalate has a negative temperature characteristic, and the acoustic constant of silicon oxide has a positive temperature characteristic. Thus, in the acoustic wave device 1, the absolute value of the TCF can be decreased.

A thickness of the low acoustic velocity film 4 is preferably, for example, equal to or smaller than about 2.0λ when λ is the wavelength of the acoustic wave determined by the electrode finger pitch P1. For example, when the wavelength λ of the acoustic wave is about 2 μm, the thickness of the low acoustic velocity film 4 is about 0.2λ (about 400 nm). By setting the thickness of the low acoustic velocity film 4 to be equal to or smaller than about 2.0λ, film stress can be reduced. As a result, it is possible to reduce warpage of a silicon wafer from which the support substrate 2 is made when the acoustic wave device 1 is manufactured, and it is possible to improve the non-defective rate and stabilize the characteristics.

Additionally, the acoustic wave device 1 may include, for example, an adhesion layer interposed between the low acoustic velocity film 4 and the piezoelectric layer 3. This can improve the adhesion between the low acoustic velocity film 4 and the piezoelectric layer 3. The adhesion layer is made of, for example, resin (epoxy resin, polyimide resin, or the like), metal, or the like. Also, the acoustic wave device 1 may include a dielectric film at any one of positions being between the low acoustic velocity film 4 and the piezoelectric layer 3, on the piezoelectric layer 3, and under the low acoustic velocity film 4, instead of the adhesion layer.

(2.4) High Acoustic Velocity Film

As illustrated in FIG. 2, the high acoustic velocity film 5 is provided between the support substrate 2 and the low acoustic velocity film 4 in the thickness direction (first direction D1) of the support substrate 2. In the example illustrated in FIG. 2, the high acoustic velocity film 5 is provided over the support substrate 2. The phrase that "the high acoustic velocity film 5 is provided over the support substrate 2" includes a case where the high acoustic velocity film 5 is directly provided on the support substrate 2 without another layer interposed therebetween and a case where the high acoustic velocity film 5 is indirectly provided on the support substrate 2 with another layer interposed therebetween.

The high acoustic velocity film 5 is a film in which an acoustic velocity of a bulk wave propagating through the high acoustic velocity film 5 is higher than the acoustic velocity of the acoustic wave propagating through the piezoelectric layer 3. A thickness of the high acoustic velocity film 5 is, for example, about 200 nm, about 300 nm, about 400 nm, or about 600 nm. For example, when the acoustic wave has a wavelength λ of about 2 μm, the high acoustic velocity film 5 has a thickness of about 0.3λ (about 600 nm). Regarding the thickness of the high acoustic velocity film 5, since the high acoustic velocity film 5 has a function of confining the acoustic wave in the piezoelectric layer 3 and the low acoustic velocity film 4, it is preferable that the thickness of the high acoustic velocity film 5 is as thick as possible.

The high acoustic velocity film 5 reduces or prevents leakage of the energy of the acoustic wave of the main mode to a structure below the high acoustic velocity film 5. In the acoustic wave device 1, when the thickness of the high acoustic velocity film 5 is sufficiently large, the energy of the acoustic wave of the main mode is distributed throughout the piezoelectric layer 3 and the low acoustic velocity film 4, is also distributed in a portion of the high acoustic velocity film 5 at the low acoustic velocity film 4 side, and is not distributed in the support substrate 2. The mechanism of confining the acoustic wave by the high acoustic velocity film 5 is the same as or similar to a mechanism in a case of a surface wave of a Love wave type that is a non-leaking SH wave, and is described in, for example, "Introduction of Simulation Technology for Surface Acoustic Wave Device", Ken-ya Hashimoto, Realize Corporation, pp. 26 to 28. The mechanism described above is different from a mechanism in which an acoustic wave is confined using a Bragg reflector based on an acoustic multilayer film.

A material of the high acoustic velocity film 5 is, for example, silicon nitride. Note that the material of the high acoustic velocity film 5 is not limited to silicon nitride, and may be at least one material selected from the group consisting of, for example, diamond-like carbon, aluminum nitride, aluminum oxide, silicon carbide, silicon, sapphire, a piezoelectric substance (e.g., lithium tantalate, lithium niobate, or crystal), alumina, zirconia, cordierite, mullite, steatite, forsterite, magnesia, and diamond. The material of the high acoustic velocity film 5 may be a material including any one of the above-described materials as a main component or a material including a mixture including any one of the above-described materials as a main component.

(2.5) IDT Electrode

As illustrated in FIG. 1 and FIG. 2, the IDT electrode 6 is provided on the piezoelectric layer 3. More specifically, the IDT electrode 6 is provided on the first main surface 31 of the piezoelectric layer 3 in the thickness direction (first direction D1) of the support substrate 2.

As illustrated in FIG. 1, the IDT electrode 6 includes two electrodes 61. In other words, the IDT electrode 6 includes two busbars 62 and two sets of electrode fingers 63. More specifically, the IDT electrode 6 includes a first electrode 61A and a second electrode 61B. Each of the first electrode 61A and the second electrode 61B has electrical conductivity. The first electrode 61A and the second electrode 61B are separated from each other and electrically insulated from each other.

The first electrode 61A has a comb shape in a plan view from the thickness direction (first direction D1) of the support substrate 2. The first electrode 61A includes a first busbar 62A and a plurality of first electrode fingers 63A. The first busbar 62A is a conductor causing the plurality of first electrode fingers 63A to have the same potential (equipotential).

The second electrode 61B has a comb shape in a plan view from the thickness direction (the first direction D1) of the support substrate 2. The second electrode 61B includes a second busbar 62B and a plurality of second electrode fingers 63B. The second busbar 62B is a conductor causing the plurality of second electrode fingers 63B to have the same potential (equipotential). In the IDT electrode 6, the first busbar 62A and the second busbar 62B face each other in a third direction D3.

The plurality of first electrode fingers 63A are connected to the first busbar 62A and extend toward the second busbar 62B side. The plurality of first electrode fingers 63A are integral with the first busbar 62A and are separated from the second busbar 62B.

The plurality of second electrode fingers 63B are connected to the second busbar 62B and extend toward the first busbar 62A side. The plurality of second electrode fingers 63B are integral with the second busbar 62B and are separated from the first busbar 62A.

The IDT electrode 6 is, for example, a normal IDT electrode. Hereinafter, the IDT electrode 6 will be described in more detail.

The first busbar 62A and the second busbar 62B of the IDT electrode 6 have an elongated shape whose longitudinal direction is a second direction D2. In the IDT electrode 6, the first busbar 62A and the second busbar 62B face each other in the third direction D3. The second direction D2 is orthogonal or substantially orthogonal to the thickness direction (first direction D1) of the support substrate 2. The third direction D3 is orthogonal or substantially orthogonal to both the thickness direction of the support substrate 2 (the first direction D1) and the second direction D2.

The plurality of first electrode fingers 63A are connected to the first busbar 62A and extend toward the second busbar 62B. Here, the plurality of first electrode fingers 63A extend from the first busbar 62A along the third direction D3. Tips of the plurality of first electrode fingers 63A are separated from the second busbar 62B. For example, the plurality of first electrode fingers 63A have the same or substantially the same length and intersecting width W1 as each other.

The plurality of second electrode fingers 63B are connected to the second busbar 62B and extend toward the first busbar 62A. Here, the plurality of second electrode fingers 63B extend from the second busbar 62B along the third direction D3. Tips of the plurality of second electrode fingers 63B are separated from the first busbar 62A. For example, the plurality of second electrode fingers 63B have the same or substantially the same length and intersecting width W1 as each other. In the example of FIG. 1, the lengths and intersecting width W1 of the plurality of second electrode fingers 63B are respectively, for example, the same or substantially the same as the lengths and intersecting width W1 of the plurality of first electrode fingers 63A.

In the IDT electrode 6, the plurality of first electrode fingers 63A and the plurality of second electrode fingers 63B are alternately arranged one by one in the second direction D2 so as to be spaced apart from each other. Thus, the first electrode finger 63A and the second electrode finger 63B that are adjacent to each other are spaced apart from each other by a distance Si. A group of electrode fingers 63 including the plurality of first electrode fingers 63A and the plurality of second electrode fingers 63B only needs to have a configuration in which the plurality of first electrode fingers 63A and the plurality of second electrode fingers 63B are arranged so as to be spaced apart from each other in the second direction D2, and may have a configuration in which the plurality of first electrode fingers 63A and the plurality of second electrode fingers 63B are not alternately arranged so as to be spaced apart from each other. For example, a region in which one first electrode finger 63A and one second electrode finger 63B are spaced apart from each other and a region in which two first electrode fingers 63A or two second electrode fingers 63B are arranged in the second direction D2 may be alternatingly provided.

The plurality of first electrode fingers 63A and the plurality of second electrode fingers 63B are interdigitated with each other. Here, the term "intersecting width" refers to an overlapping length of the first electrode finger 63A and the second electrode finger 63B in a view from a propagation direction of the acoustic wave. In other words, the IDT electrode 6 includes an intersection region defined by the plurality of first electrode fingers 63A and the plurality of second electrode fingers 63B. The intersection region is a region between the envelope of the tips of the plurality of first electrode fingers 63A and the envelope of the tips of the plurality of second electrode fingers 63B. The IDT electrode 6 excites the acoustic wave in the piezoelectric layer 3 in the intersection region.

The IDT electrode 6 is not limited to a normal IDT electrode, and may be, for example, an IDT electrode subjected to apodization weighting or an inclined IDT electrode. In the IDT electrode subjected to apodization weighting, the intersecting width increases closer to the center from one end portion in the propagation direction of the acoustic wave, and the intersecting width decreases closer to the other end portion from the center in the propagation direction of the acoustic wave.

As illustrated in FIG. 1, the electrode finger pitch P1 of the IDT electrode 6 is defined by a distance between the center lines of two adjacent first electrode fingers 63A among the plurality of first electrode fingers 63A or a distance between the center lines of two adjacent second electrode fingers 63B among the plurality of second electrode fingers 63B. The distance between the center lines of two adjacent second electrode fingers 63B is the same as the distance between the center lines of two adjacent first electrode fingers 63A.

In the IDT electrode 6 of the acoustic wave device 1 according to the present preferred embodiment, the number of pairs of the first electrode fingers 63A and the second electrode fingers 63B is, for example, 100. In other words, the IDT electrode 6 includes, for example, 100 first electrode fingers 63A and 100 second electrode fingers 63B.

A material of the IDT electrode 6 is an appropriate metal material such as, for example, aluminum (Al), copper (Cu), platinum (Pt), gold (Au), silver (Ag), titanium (Ti), nickel (Ni), chromium (Cr), molybdenum (Mo), tungsten (W) or the like, or an alloy mainly including any one of these metals or the like. Further, the IDT electrode 6 may have a structure in which a plurality of metal films made of these metals or the alloy are laminated.

(2.6) Reflector

As illustrated in FIG. 1, the two reflectors 7 are provided on the piezoelectric layer 3. More specifically, the two reflectors 7 are provided on the first main surface 31 of the piezoelectric layer 3 in the thickness direction (the first direction D1) of the support substrate 2. Each of the two reflectors 7 has electrical conductivity.

The two reflectors 7 are positioned in a one-to-one manner at one side and the other side of the IDT electrode 6 in a direction (second direction D2) along the propagation direction of the acoustic wave of the acoustic wave device 1. In other words, the IDT electrode 6 is positioned between the two reflectors 7 in the second direction D2. Each reflector 7 is, for example, a short-circuit grating. Each reflector 7 reflects the acoustic wave.

Each of the two reflectors 7 includes a plurality of electrode fingers 71, the plurality of electrode fingers 71 are short-circuited to each other at first ends, and are short-circuited to each other at second ends. In each of the two reflectors 7, the number of electrode fingers is, for example, 20.

A material of each reflector 7 is an appropriate metal material such as, for example, aluminum (Al), copper (Cu), platinum (Pt), gold (Au), silver (Ag), titanium (Ti), nickel (Ni), chromium (Cr), molybdenum (Mo), tungsten (W) or the like, or an alloy mainly including any one of these metals or the like. Further, each reflector 7 may have a structure in which a plurality of metal films made of these metals or the alloy are laminated.

In the acoustic wave device 1, when the reflectors 7 and the IDT electrode 6 are made of the same material and have the same or substantially the same thickness, the reflectors 7 and the IDT electrode 6 can be formed in the same process in manufacturing the acoustic wave device 1.

In the acoustic wave device 1 according to the present preferred embodiment, each reflector 7 is the short-circuit grating, but each reflector 7 is not limited to the short-circuit grating, and may be, for example, an open grating, a positive/negative reflection-type grating, or a grating in which a short-circuit grating and an open grating are combined.

(2.7) Wiring Portion

As illustrated in FIG. 1, the wiring portion 8 is provided on the piezoelectric layer 3. More specifically, the wiring portion 8 is provided on the first main surface 31 of the piezoelectric layer 3 in the thickness direction (first direction D1) of the support substrate 2. The wiring portion 8 has electrical conductivity.

The wiring portion 8 includes a first wiring portion 81 and a second wiring portion 82. The first wiring portion 81 is connected to the first busbar 62A of the IDT electrode 6. The second wiring portion 82 is connected to the second busbar 62B of the IDT electrode 6. The first wiring portion 81 and the second wiring portion 82 are spaced apart from each other and electrically insulated from each other.

The first wiring portion 81 extends from the first busbar 62A to the side opposite to the plurality of first electrode fingers 63A. The first wiring portion 81 may partially overlap the first busbar 62A in the thickness direction (first direction D1) of the support substrate 2, or may be integral with the first busbar 62A with the same material so as to have the same or substantially the same thickness as those of the first busbar 62A.

The second wiring portion 82 extends from the second busbar 62B to the side opposite to the plurality of second electrode fingers 63B. The second wiring portion 82 may partially overlap the second busbar 62B in the thickness direction (first direction D1) of the support substrate 2, or may be integral with the second busbar 62B with the same material so as to have the same or substantially the same thickness as those of the second busbar 62B.

A material of the wiring portion 8 is an appropriate metal material such as, for example, aluminum (Al), copper (Cu), platinum (Pt), gold (Au), silver (Ag), titanium (Ti), nickel (Ni), chromium (Cr), molybdenum (Mo), tungsten (W) or the like, or an alloy mainly including any one of these metals or the like. Further, the wiring portion 8 may have a structure in which a plurality of metal films made of these metals or the alloy are laminated.

(2.8) Protective Film

The protective film (not illustrated) is provided over the piezoelectric layer 3. The protective film covers the IDT electrode 6, the reflectors 7, and the wiring portion 8 on the first main surface 31 of the piezoelectric layer 3, and a portion of the first main surface 31 of the piezoelectric layer 3.

A material of the protective film is, for example, silicon oxide. The material of the protective film is not limited to silicon oxide and may be, for example, silicon nitride. The protective film is not limited to a single layer structure, and may have, for example, a multilayer structure including two or more layers.

(3) Characteristics of Acoustic Wave Device

Hereinafter, characteristics of the acoustic wave device 1 according to the present preferred embodiment will be described in comparison with an acoustic wave device of a comparative example with reference to the drawings.

Figure 8:
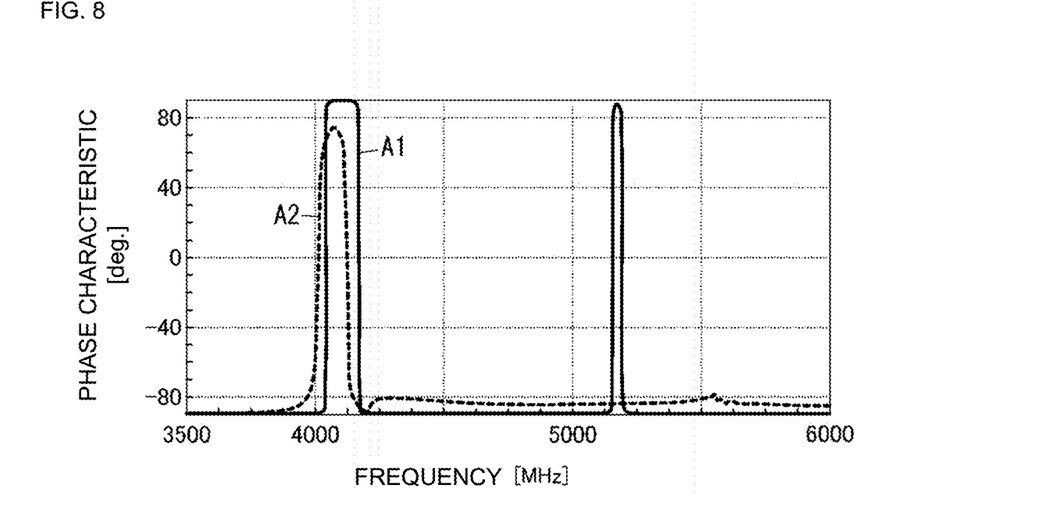
FIG. 8 is a graph showing a phase characteristic of an acoustic wave device according to a comparative example.

First, the acoustic wave device of the comparative example will be described. When a piezoelectric layer is a piezoelectric substrate, a higher order mode is not generated as indicated by a characteristic A2 in FIG. 8. On the other hand, in a case where a piezoelectric layer is thinner than a piezoelectric substrate and has a laminated structure including a support substrate and the piezoelectric layer, the higher order mode is generated as indicated by a characteristic A1 in FIG. 8. As described above, the higher order mode is a spurious mode generated at a side higher in frequency than the main mode of the acoustic wave propagating through the piezoelectric layer 3.

Figure 9:
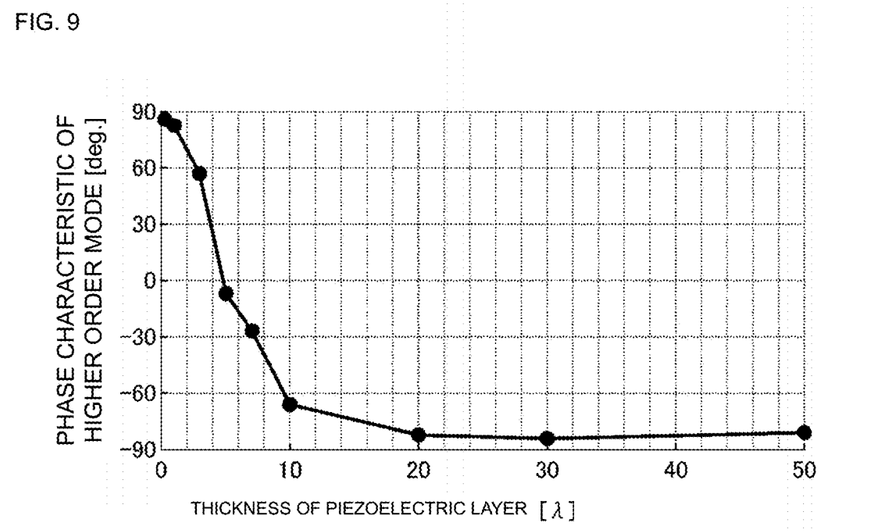
FIG. 9 is a graph showing a phase characteristic of a higher order mode in the acoustic wave device according to the comparative example.

In the case of the laminated structure with the support substrate and the piezoelectric layer, as illustrated in FIG. 9, the higher order mode is small in a range where a thickness of the piezoelectric layer is larger than about 10λ. In a range where the thickness of the piezoelectric layer is equal to or smaller than about 10λ, the higher order mode is generated. When the thickness of the piezoelectric layer is equal to or smaller than about 5λ, the higher order mode increases. When the thickness of the piezoelectric layer is equal to or smaller than about 1λ, a phase approaches 90°, and characteristics of the acoustic wave device are significantly degraded.

Figure 3:
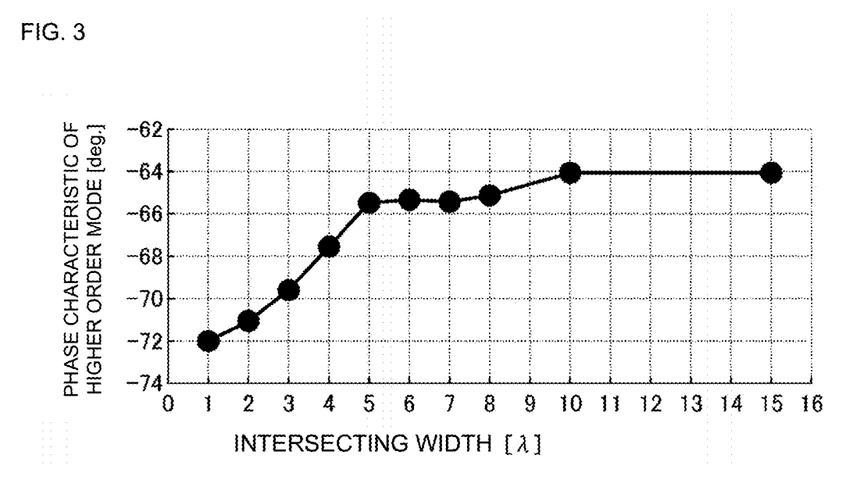
FIG. 3 is a graph showing a phase characteristic of a higher order mode of the above-described acoustic wave device.

Due to this, even when the thickness of the piezoelectric layer is equal to or smaller than about 10λ, in order to reduce the higher order mode, in the acoustic wave device 1 according to the present preferred embodiment, the intersecting width W1 of the plurality of electrode fingers 63 is set to be equal to or smaller than about 5λ. When the intersecting width W1 is equal to or smaller than about 5λ, as illustrated in FIG. 3, the phase characteristic of the higher order mode can be improved. FIG. 3 is a graph showing the phase characteristic of the higher order mode with respect to the intersecting width W1. In a range where the intersecting width W1 is equal to or smaller than about 5λ, the higher order mode becomes smaller as the intersecting width W1 becomes smaller.

Conditions of the acoustic wave device 1 for obtaining the characteristic illustrated in FIG. 3 are as follows. A thickness of the IDT electrode 6 is about 0.05λ, a thickness of the piezoelectric layer 3 is about 0.2λ, a thickness of the low acoustic velocity film 4 is about 0.2λ, and a thickness of the high acoustic velocity film 5 is about 0.3λ. A material of the IDT electrode 6 is aluminum, a material of the piezoelectric layer 3 is lithium tantalate, a material of the low acoustic velocity film 4 is silicon oxide, a material of the high acoustic velocity film 5 is silicon nitride, and a material of the support substrate 2 is silicon.

Figure 5A:
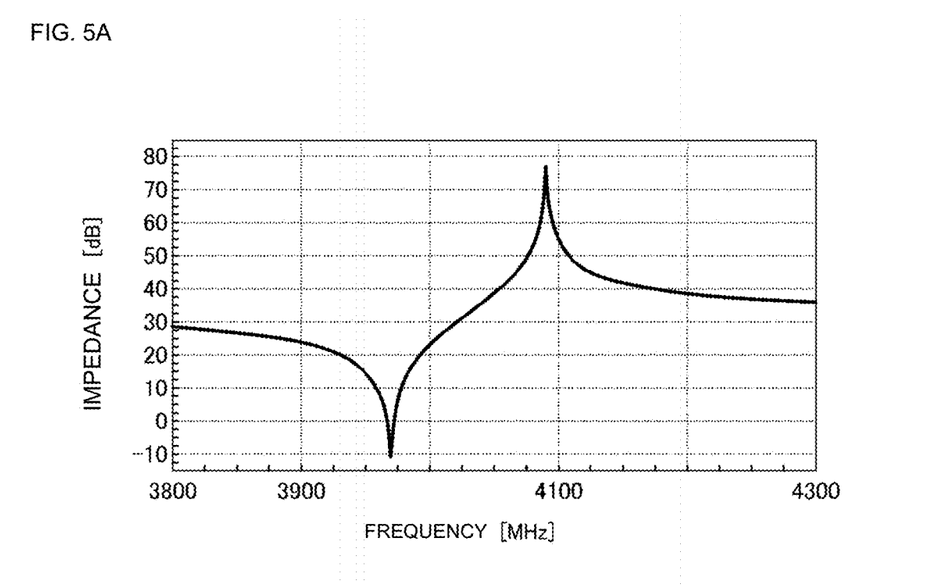
FIG. 5A is a graph showing an impedance characteristic in a case where the intersecting width is about $2\lambda$ in the above-described acoustic wave device.
Figure 5B:
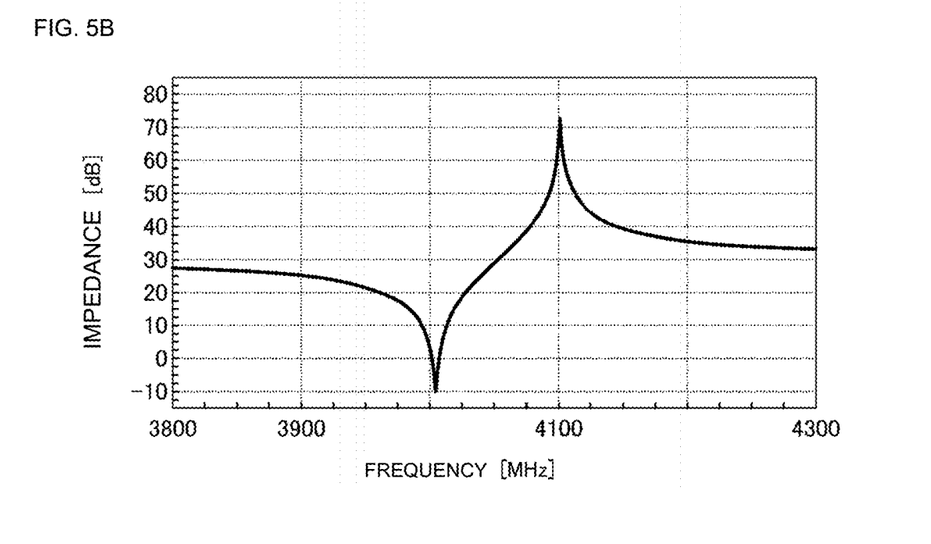
FIG. 5B is a graph showing an impedance characteristic in a case where the intersecting width is about $1\lambda$ in the above-described acoustic wave device.

The intersecting width W1 of the plurality of electrode fingers 63 is preferably equal to or smaller than about 2λ. When the intersecting width W1 is equal to or smaller than about 2λ, a spurious response of a transverse mode can be reduced as illustrated in FIG. 5A and FIG. 5B. In other words, the transverse mode can be reduced or prevented. FIG. 5A illustrates an impedance when the intersecting width W1 is about 2λ. FIG. 5B illustrates an impedance when the intersecting width W1 is about 1λ.

Figure 4A:
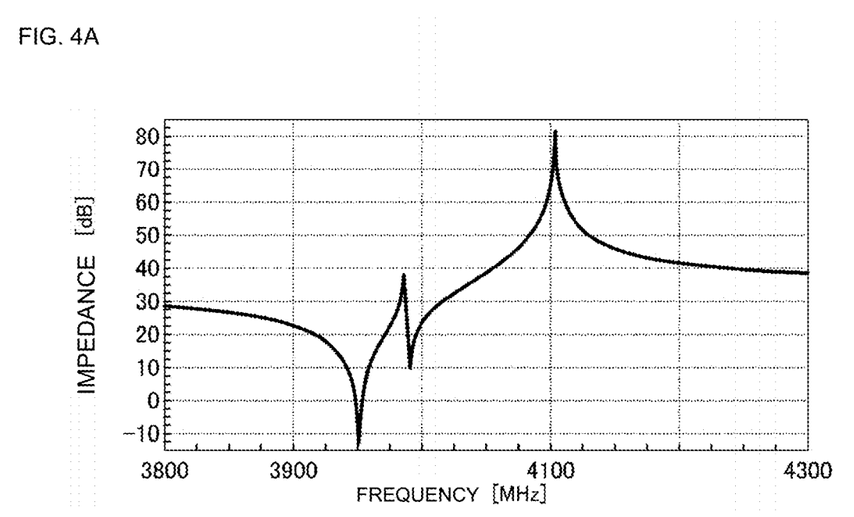
FIG. 4A is a graph showing an impedance characteristic in a case where an intersecting width is about $5\lambda$ in the above-described acoustic wave device.
Figure 4B:
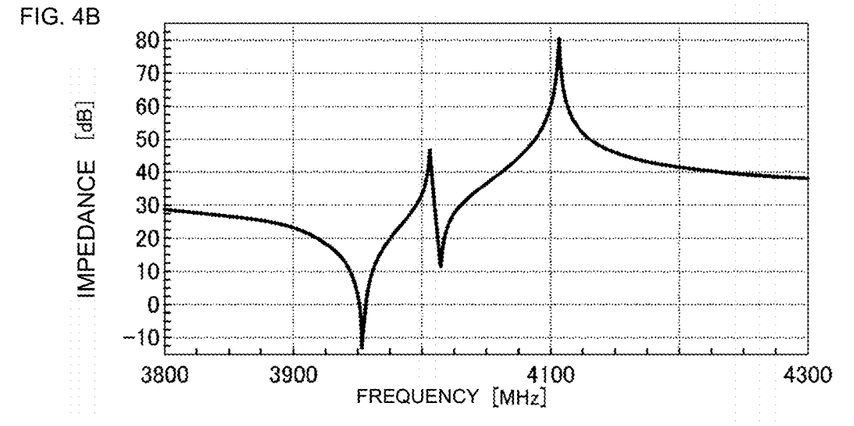
FIG. 4B is a graph showing an impedance characteristic in a case where the intersecting width is about $4\lambda$ in the above-described acoustic wave device.
Figure 4C:
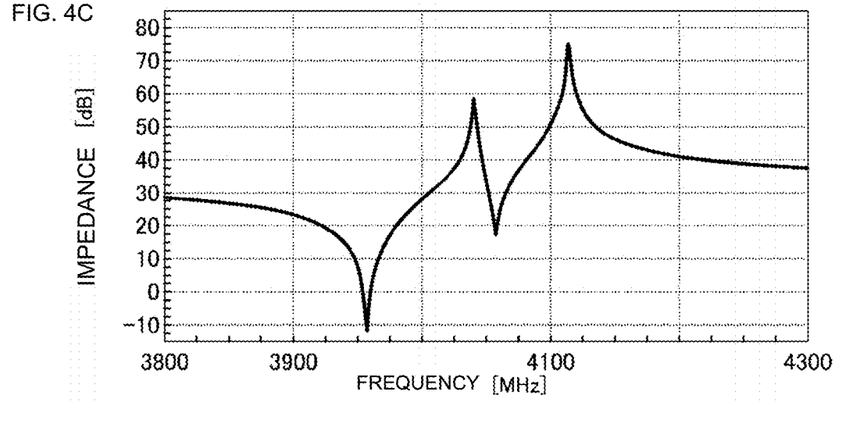
FIG. 4C is a graph showing an impedance characteristic in a case where the intersecting width is about $3\lambda$ in the above-described acoustic wave device.
Figure 10:
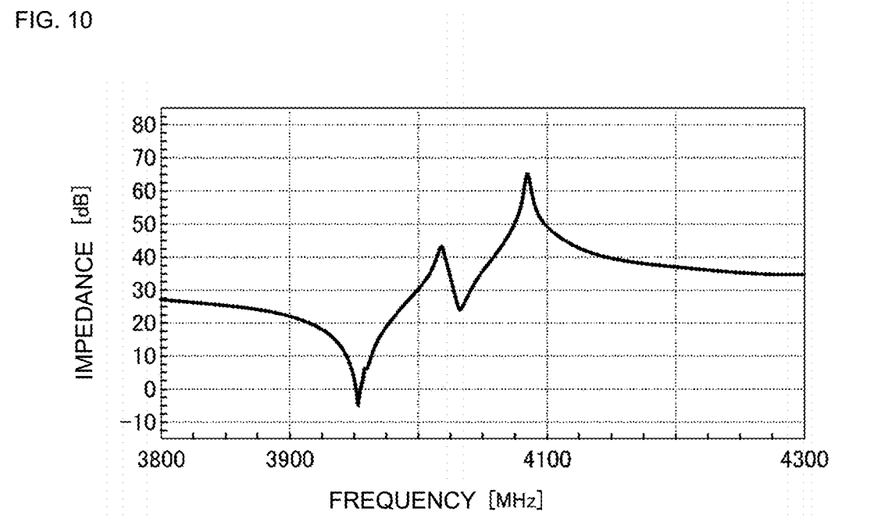
FIG. 10 is a graph showing an impedance characteristic in a case where an intersecting width is $6\lambda$ in the acoustic wave device according to the comparative example.

On the other hand, when the intersecting width W1 is larger than about 2λ, as illustrated in FIGS. 4A to 4C, a peak caused by the transverse mode is generated in a frequency band between an anti-resonant frequency and a resonant frequency. Also, when the intersecting width W1 is larger than about 5λ, as illustrated in FIG. 10, a peak caused by the transverse mode is generated in a frequency band between an anti-resonant frequency and a resonant frequency.

(4) Advantageous Effects

In the acoustic wave device 1 according to the present preferred embodiment, the intersecting width W1 of the plurality of electrode fingers 63 of the IDT electrode 6 is equal to or smaller than about 5λ. With this configuration, when the acoustic wave device 1 is used for a filter, it is possible to reduce a spurious response of a higher order mode generated in a band higher in frequency of the pass band of the filter. It is possible to reduce a spurious response of a higher order mode generated in a band higher in frequency than an excitation mode to be used for obtaining required characteristics.

In the acoustic wave device 1 according to the present preferred embodiment, the intersecting width W1 of the plurality of electrode fingers 63 of the IDT electrode 6 is equal to or smaller than about 2λ. Thus, the transverse mode can be reduced or prevented.

In the acoustic wave device 1 according to the present preferred embodiment, the low acoustic velocity film 4 is provided between the support substrate 2 and the piezoelectric layer 3 in the thickness direction (first direction D1) of the support substrate 2. Thus, the Q value of the acoustic wave device 1 can be improved.

In the acoustic wave device 1 according to the present preferred embodiment, the high acoustic velocity film 5 is provided between the support substrate 2 and the low acoustic velocity film 4 in the thickness direction (first direction D1) of the support substrate 2. Thus, the Q value of the acoustic wave device 1 can be further improved.

(5) Modifications

Hereinafter, modifications of the present preferred embodiment will be described.

Figure 6:
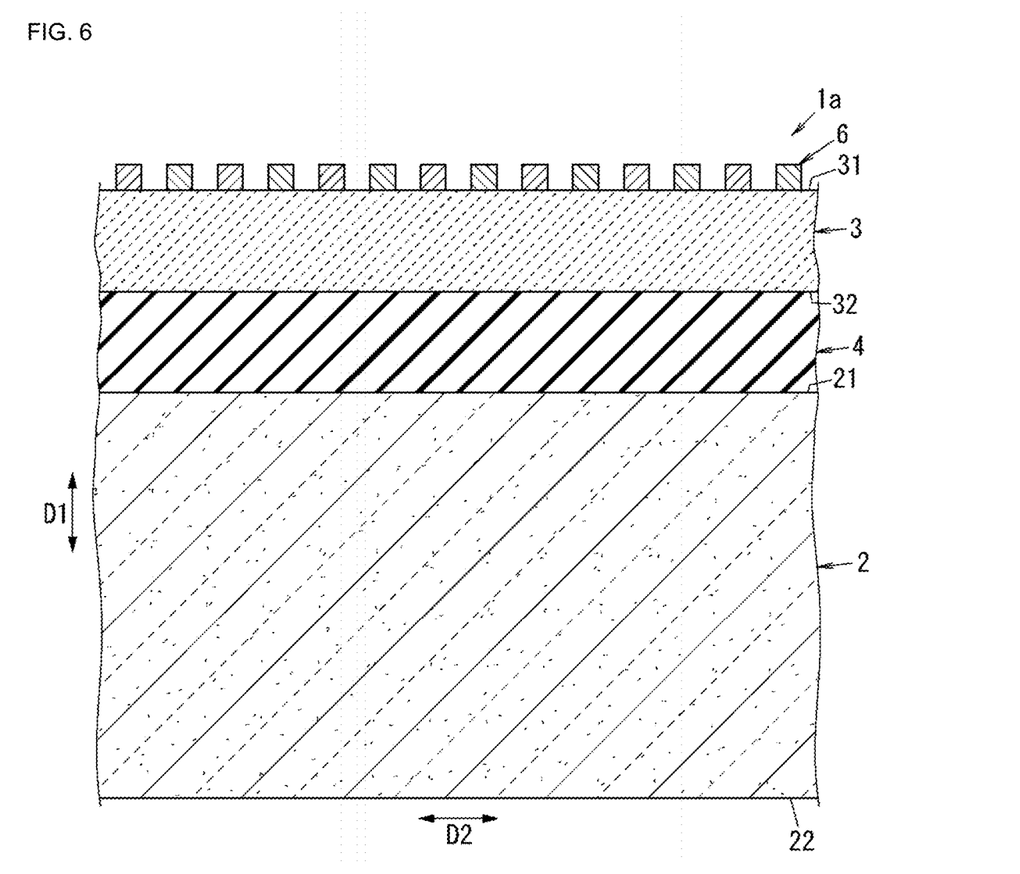
FIG. 6 is a cross-sectional view of an acoustic wave device according to Modification 1 of a preferred embodiment of the present invention.

As Modification 1 of the present preferred embodiment, as illustrated in FIG. 6, an acoustic wave device 1a does not need to include the high acoustic velocity film 5. On the other hand, the acoustic wave device 1a includes the support substrate 2, the piezoelectric layer 3, the low acoustic velocity film 4, and the IDT electrode 6, similarly to the acoustic wave device 1 according to the present preferred embodiment.

In the acoustic wave device 1a according to Modification 1, the support substrate 2 is a high acoustic velocity support substrate. Thus, compared to the Q value of the acoustic wave device 1, a Q value can be further improved.

Figure 7:
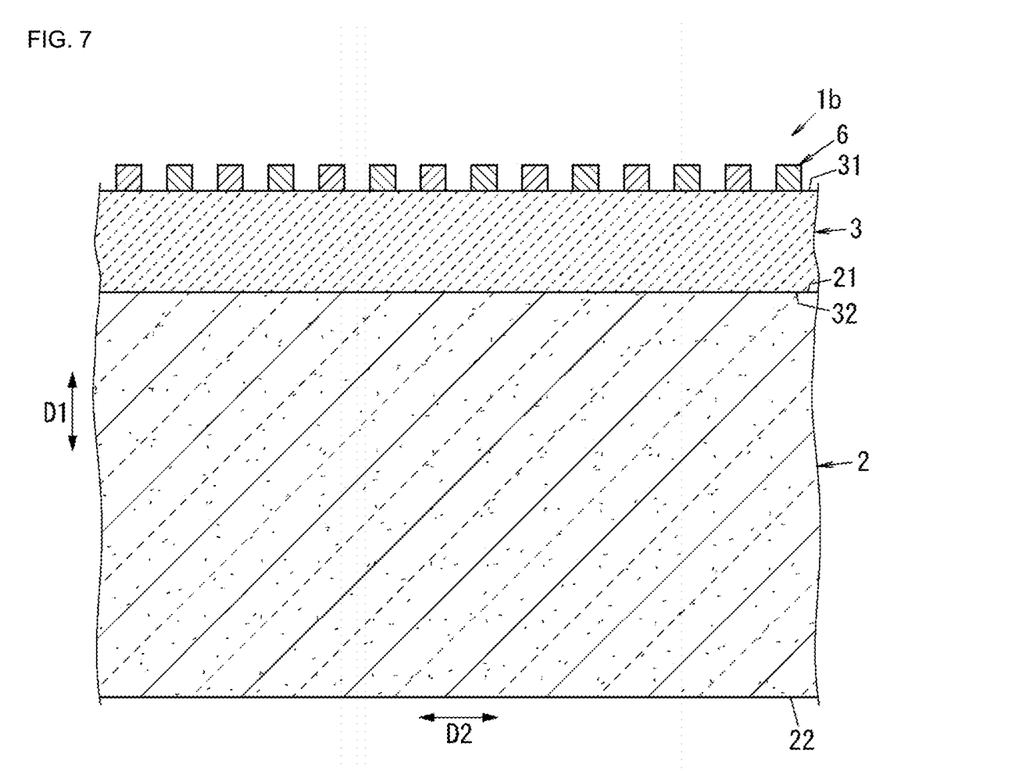
FIG. 7 is a cross-sectional view of an acoustic wave device according to Modification 2 of a preferred embodiment of the present invention.

As Modification 2 of the present preferred embodiment, as illustrated in FIG. 7, in an acoustic wave device 1b, the piezoelectric layer 3 may be provided directly on the support substrate 2. That is, the acoustic wave device 1b does not need to include the low acoustic velocity film 4 and the high acoustic velocity film 5. On the other hand, the acoustic wave device 1b includes the support substrate 2, the piezoelectric layer 3, and the IDT electrode 6, similarly to the acoustic wave device 1 according to the present preferred embodiment.

The acoustic wave device 1a according to Modification 1 and the acoustic wave device 1b according to Modification 2 also obtain the same or similar advantageous effects to those of the acoustic wave device 1 according to the present preferred embodiment.

The acoustic wave device 1 may include, for example, an adhesion layer, a dielectric film, and the like as films other than the high acoustic velocity film 5, the low acoustic velocity film 4, and the piezoelectric layer 3.

The acoustic wave device 1 may further include a first terminal connected to the first busbar 62A with the first wiring portion 81 of the wiring portion 8 interposed therebetween, and a second terminal connected to the second busbar 62B with the second wiring portion 82 of the wiring portion 8 interposed therebetween. In addition, the acoustic wave device 1 may further include two third wiring portions connected one-to-one to the two reflectors 7. In this case, each of the two reflectors 7 may be connected to a third terminal with at least the corresponding third wiring portion interposed therebetween. A plurality of external connection terminals including the first terminal, the second terminal, and the third terminal are electrodes providing electrical connection to a circuit substrate, a mount substrate (sub-mount substrate) for a package, or the like in the acoustic wave device 1. Additionally, the acoustic wave device 1 may further include a plurality of dummy terminals that are not electrically connected to the IDT electrode 6. The plurality of dummy terminals are terminals improve the parallelism of the acoustic wave device 1 with respect to a circuit substrate, a mount substrate, or the like, and are different from terminals providing electrical connection. That is, the dummy terminal is a terminal reducing or preventing mounting of the acoustic wave device 1 on a circuit substrate, a mount substrate, or the like in an inclined manner, and is not necessarily provided depending on the number and arrangement of the external connection terminals, an outer peripheral shape of the acoustic wave device 1, and the like.

For example, the first terminal is integral with the first wiring portion 81 by using the same material so as to have the same or substantially the same thickness as those of the first wiring portion 81. The second terminal is, for example, integral with the second wiring portion 82 by using the same material so as to have the same or substantially the same thickness as those of the second wiring portion 82. The third terminal is, for example, integral with the third wiring portion by using the same material so as to have the same or substantially the same thickness as those of the third wiring portion. The third wiring portion is, for example, made by using the same material so as to have the same or substantially the same thickness as those of the first wiring portion 81 and the second wiring portion 82.

The preferred embodiments and modifications described above are merely some of various preferred embodiments and modifications of the present invention. In addition, the preferred embodiments and modifications can be variously modified according to design or the like as long as the advantageous effects of the present invention can be achieved.

(Aspects)

The following aspects are disclosed herein.

An acoustic wave device (1; 1a; 1b) according to a preferred embodiment of the present invention includes a support substrate (2), a piezoelectric layer (3), and an IDT electrode (6). The piezoelectric layer (3) is provided over the support substrate (2) in a thickness direction (first direction D1) of the support substrate (2). The IDT electrode 6 is provided on the piezoelectric layer 3. The IDT electrode 6 includes a plurality of electrode fingers 63. An intersecting width (W1) of the plurality of electrode fingers (63) is equal to or smaller than about 5λ.

In the above-described acoustic wave device (1) according to a preferred embodiment of the present invention, the intersecting width W1 of the plurality of electrode fingers (63) of the IDT electrode (6) is equal to or smaller than about 5λ. With this configuration, when the acoustic wave device (1) is used for a filter, it is possible to reduce a spurious response of a higher order mode generated in a band higher in frequency of a pass band of the filter. It is possible to reduce a spurious response of a higher order mode generated in a band higher in frequency than an excitation mode to be used for obtaining required characteristics.

In an acoustic wave device (1; 1a; 1b) according to a preferred embodiment of the present invention, the intersecting width (W1) of the plurality of electrode fingers (63) is smaller than or equal to about 2λ.

In the above-described acoustic wave device (1; 1a; 1b), the intersecting width (W1) of the plurality of electrode fingers (63) of the IDT electrode (6) is equal to or smaller than about 2λ. Thus, a transverse mode can be reduced or prevented.

An acoustic wave device (1; 1a) according to a preferred embodiment of the present invention further includes a low acoustic velocity film (4). In the low acoustic velocity film (4), an acoustic velocity of a bulk wave propagating through the low acoustic velocity film (4) is lower than an acoustic velocity of a bulk wave propagating through the piezoelectric layer (3). The low acoustic velocity film (4) is provided between the support substrate (2) and the piezoelectric layer (3) in the thickness direction (first direction D1) of the support substrate (2). The above-described acoustic wave device (1; 1a) can improve a Q value of the acoustic wave device (1; 1a). An acoustic wave device (1) according to a preferred embodiment of the present invention further includes a high acoustic velocity film (5). In the high acoustic velocity film (5), an acoustic velocity of a bulk wave propagating through the high acoustic velocity film (5) is higher than an acoustic velocity of an acoustic wave propagating through the piezoelectric layer (3). The high acoustic velocity film (5) is provided between the support substrate (2) and the low acoustic velocity film (4) in the thickness direction (first direction D1) of the support substrate (2).

The above-described acoustic wave device (1) can further improve the Q value of the acoustic wave device (1).

In an acoustic wave device (1a) according to a preferred embodiment of the present invention, the support substrate (2) is a high acoustic velocity support substrate. In the high acoustic velocity support substrate, an acoustic velocity of a bulk wave propagating through the high acoustic velocity support substrate is higher than an acoustic velocity of an acoustic wave propagating through the piezoelectric layer (3).

The above-described acoustic wave device (1a) can further improve the Q value of the acoustic wave device (1a). In an acoustic wave device (1; 1a; 1b) according to a preferred embodiment of the present invention, the piezoelectric layer (3) is made of lithium tantalate.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
a support substrate;
a piezoelectric layer over the support substrate in a thickness direction of the support substrate; and
an IDT electrode on the piezoelectric layer, the IDT electrode including a plurality of electrode fingers; wherein
an intersecting width of the plurality of electrode fingers is equal to or smaller than about 5λ.

2. The acoustic wave device according to claim 1, wherein the intersecting width of the plurality of electrode fingers is equal to or smaller than about 2λ.

3. The acoustic wave device according to claim 1, further comprising:
a low acoustic velocity film in which an acoustic velocity of a bulk wave propagating through the low acoustic velocity film is lower than an acoustic velocity of a bulk wave propagating through the piezoelectric layer; wherein
the low acoustic velocity film is between the support substrate and the piezoelectric layer in the thickness direction of the support substrate.

4. The acoustic wave device according to claim 3, further comprising:
a high acoustic velocity film in which an acoustic velocity of a bulk wave propagating through the high acoustic velocity film is higher than an acoustic velocity of an acoustic wave propagating through the piezoelectric layer; wherein
the high acoustic velocity film is between the support substrate and the low acoustic velocity film in the thickness direction of the support substrate.

5. The acoustic wave device according to claim 3, wherein the support substrate is a high acoustic velocity support substrate in which an acoustic velocity of a bulk wave propagating through the high acoustic velocity support substrate is higher than an acoustic velocity of an acoustic wave propagating through the piezoelectric layer.

6. The acoustic wave device according to claim 1, wherein the piezoelectric layer is made of lithium tantalate.

7. The acoustic wave device according to claim 2, further comprising:
- a low acoustic velocity film in which an acoustic velocity of a bulk wave propagating through the low acoustic velocity film is lower than an acoustic velocity of a bulk wave propagating through the piezoelectric layer; wherein
- the low acoustic velocity film is between the support substrate and the piezoelectric layer in the thickness direction of the support substrate.

8. The acoustic wave device according to claim 7, further comprising:
- a high acoustic velocity film in which an acoustic velocity of a bulk wave propagating through the high acoustic velocity film is higher than an acoustic velocity of an acoustic wave propagating through the piezoelectric layer; wherein
- the high acoustic velocity film is between the support substrate and the low acoustic velocity film in the thickness direction of the support substrate.

9. The acoustic wave device according to claim 7, wherein the support substrate is a high acoustic velocity support substrate in which an acoustic velocity of a bulk wave propagating through the high acoustic velocity support substrate is higher than an acoustic velocity of an acoustic wave propagating through the piezoelectric layer.

10. The acoustic wave device according to claim 2, wherein the piezoelectric layer is made of lithium tantalate.

11. The acoustic wave device according to claim 3, wherein the piezoelectric layer is made of lithium tantalate.

12. The acoustic wave device according to claim 4, wherein the piezoelectric layer is made of lithium tantalate.

13. The acoustic wave device according to claim 5, wherein the piezoelectric layer is made of lithium tantalate.

14. The acoustic wave device according to claim 7, wherein the piezoelectric layer is made of lithium tantalate.

15. The acoustic wave device according to claim 8, wherein the piezoelectric layer is made of lithium tantalate.

16. The acoustic wave device according to claim 9, wherein the piezoelectric layer is made of lithium tantalate.

* * * * *